United States Patent
Sampath

(10) Patent No.: US 9,461,664 B2
(45) Date of Patent: Oct. 4, 2016

(54) IMAGING PIXELS WITH IMPROVED ANALOG-TO-DIGITAL CIRCUITRY

(71) Applicant: Semiconductor Components Industries, LLC, Phoenix, AZ (US)

(72) Inventor: Parthasarathy Sampath, Bangalore (IN)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 203 days.

(21) Appl. No.: 14/090,415

(22) Filed: Nov. 26, 2013

(65) Prior Publication Data

US 2015/0146055 A1    May 28, 2015

(51) Int. Cl.
| | |
|---|---|
| *H04N 5/378* | (2011.01) |
| *H03M 1/44* | (2006.01) |
| *H03M 1/10* | (2006.01) |
| H03M 1/46 | (2006.01) |
| H03M 1/80 | (2006.01) |

(52) U.S. Cl.
CPC ............ *H03M 1/442* (2013.01); *H03M 1/1038* (2013.01); *H03M 1/468* (2013.01); *H03M 1/804* (2013.01)

(58) Field of Classification Search
CPC ................................................... H03M 1/1038
USPC .......................................... 348/302; 341/158
See application file for complete search history.

(56) References Cited

U.S. PATENT DOCUMENTS

| 6,891,487 B2 | 5/2005 | Leung et al. |
| 7,605,741 B2 | 10/2009 | Hurrell |

(Continued)

FOREIGN PATENT DOCUMENTS

WO    2012123578    9/2012

OTHER PUBLICATIONS

McNeil et al., "All-Digital Background Calibration of a Successive Approximation ADC using the "Split ADC" Architecture", IEEE TCAS, Oct. 1, 2011.

(Continued)

*Primary Examiner* — Joel Fosselman
(74) *Attorney, Agent, or Firm* — Treyz Law Group, P.C.

(57) ABSTRACT

Imagers may include analog-to-digital converter circuitry that produces a digital output code from an analog input voltage. The analog-to-digital converter circuitry may include a series of capacitors including a first set of binary-mapped capacitors. The analog-to-digital converter circuitry may include a second set of one or more capacitors that have capacitances that are less than binary-mapped capacitance values. The digital output code may include bits having respective bit positions within the digital output code. During successive-approximation operations performed by the analog-to-digital converter circuitry, each bit of the digital output code may be produced using a corresponding capacitor. Digital processing circuitry such as an image processor may produce a digital value from the digital output code by multiplying the bits of the digital output code with respective weights determined based on the capacitance of the corresponding capacitors.

21 Claims, 7 Drawing Sheets

(56) References Cited

U.S. PATENT DOCUMENTS

| | | |
|---|---|---|
| 7,944,379 B2 | 5/2011 | Ohnhaeuser et al. |
| 8,049,654 B2 | 11/2011 | Reinhold et al. |
| 8,446,304 B2 | 5/2013 | Scanlan |
| 2002/0126033 A1* | 9/2002 | Semmler ............. H03M 1/1023 341/158 |
| 2004/0032626 A1* | 2/2004 | Rossi ..................... H04N 5/378 358/504 |
| 2006/0176197 A1 | 8/2006 | McNeill et al. |
| 2010/0214140 A1 | 8/2010 | Reinhold et al. |
| 2013/0113638 A1 | 5/2013 | Chen et al. |

OTHER PUBLICATIONS

Chiu et al., "A 12-bit, 45-MS/s, 3-mW Redundant Successive-Approximation-Register Analog-to-Digital Converter with Digital Calibration", IEEE JSSC, Nov. 2011.

Xu et al., "Digitally Calibrated 768-KS/s 10-b Minimum-Size SAR ADC Array with Dithering", IEEE JSSC, Sep. 2012.

* cited by examiner

IMAGING PIXELS WITH IMPROVED ANALOG-TO-DIGITAL CIRCUITRY

BACKGROUND

This relates generally to imaging systems, and more particularly to imaging systems with analog-to-digital converters (ADCs).

Modern electronic devices such as cellular telephones, cameras, and computers often use digital image sensors. Imagers (i.e., image sensors) may be formed from a two-dimensional array of image sensing pixels. Each pixel receives incident photons (light) and converts the photons into electrical signals. Image sensors are sometimes designed to provide images to electronic devices using a Joint Photographic Experts Group (JPEG) format.

Imagers typically include analog-to-digital converters that convert analog pixel signals to digital values. In some scenarios, imagers include successive-approximation-register (SAR) analog-to-digital converters (ADCs) that are implemented using sets of capacitors that sample and hold analog pixel signals. A set of capacitors used for SAR is implemented in a binary arrangement in which each successive capacitor has twice the capacitance of a previous capacitor. The capacitors of the set are selectively coupled to reference, ground, and the analog pixel signals. However, in such arrangements, mismatch between the capacitors such as when a given capacitor does not have precisely twice the capacitance of a previous capacitor or half the capacitance of a subsequent capacitor can lead to incorrect analog-to-digital conversions. Mismatch between capacitors may occur due to manufacturing tolerances or other variations in fabricating the imager. To correct for mismatch, some imagers include calibration circuitry that continuously operates to correct for individual mismatch between capacitors in the analog-to-digital converters (e.g., operates in the background of image capture operations). However, such continuous background operation can consume excessive amounts of power and available circuit area. In some scenarios, calibration tests for the capacitors of each analog-to-digital converter are performed to identify mismatch due to manufacturing variations. The results of the calibration tests are stored for each capacitor of each analog-to-digital converter, which tends to occupy excessive amounts of available storage space and increases the operating overhead of the analog-to-digital converters.

DETAILED DESCRIPTION

Figure 1:
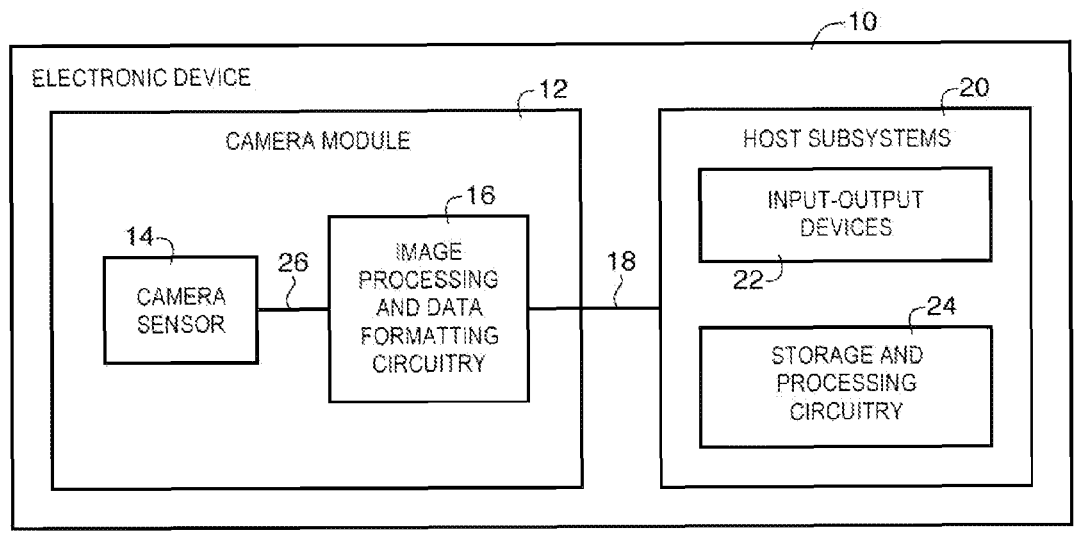
FIG. 1 is an illustrative schematic diagram of an electronic device with a camera sensor that may include pixels with improved analog-to-digital circuitry in accordance with an embodiment of the present invention.

Embodiments of the present invention relate to image sensors with analog-to-digital circuitry. In particular, image sensors may include improved analog-to-digital circuitry implementing successive-approximation analog-to-digital conversion. In general, any type of SAR ADC architecture may be provided with improved conversion capabilities. An electronic device with a digital camera module is shown in FIG. 1. Electronic device 10 may be a digital camera, a computer, a cellular telephone, a medical device, or other electronic device. Camera module 12 may include image sensor 14 and one or more lenses. During operation, the lenses focus light onto image sensor 14. Image sensor 14 includes photosensitive elements (e.g., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from camera sensor 14 may be provided to image processing and data formatting circuitry 16 via path 26. Image processing and data formatting circuitry 16 may be used to perform image processing functions such as three-dimensional depth sensing, data formatting, adjusting white balance and exposure, implementing video image stabilization, face detection, etc. Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common integrated circuit. The use of a single integrated circuit to implement camera sensor 14 and image processing and data formatting circuitry 16 can help to reduce costs.

Camera module 12 may convey acquired image data to host subsystems 20 over path 18 (e.g., image processing and data formatting circuitry 16 may convey image data to subsystems 20). Electronic device 10 typically provides a user with numerous high-level functions. In a computer or advanced cellular telephone, for example, a user may be provided with the ability to run user applications. To implement these functions, host subsystem 20 of electronic device 10 may include storage and processing circuitry 24 and input-output devices 22 such as keypads, input-output ports, joysticks, and displays. Storage and processing circuitry 24 may include volatile and nonvolatile memory (e.g., random-access memory, flash memory, hard drives, solid state drives, etc.). Storage and processing circuitry 24 may also include microprocessors, microcontrollers, digital signal processors, application specific integrated circuits, or other processing circuits.

Figure 2:
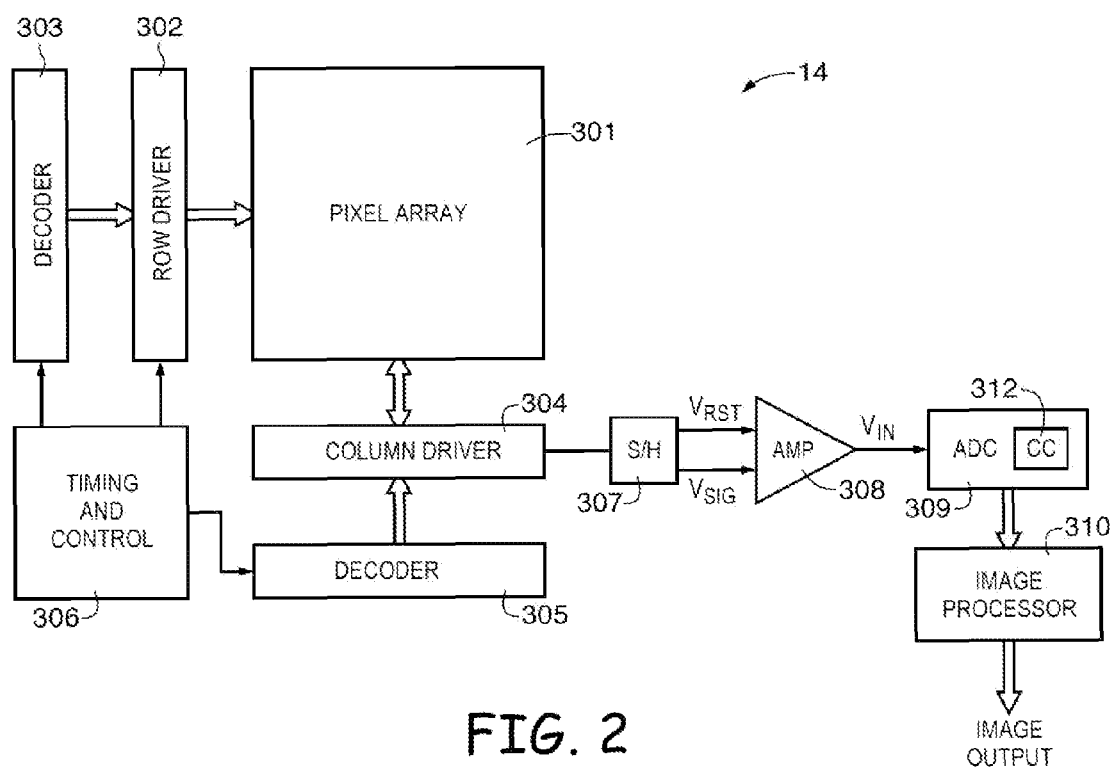
FIG. 2 is a block diagram of an imager employing improved analog-to-digital circuitry in accordance with an embodiment of the present invention.

FIG. 2 illustrates a simplified block diagram of an imager 14, for example a CMOS imager, employing a pixel array 301. Pixel array 301 includes a plurality of pixels arranged in a predetermined number of columns and rows. The row lines are selectively activated by the row driver 302 in response to row address decoder 303 and the column select lines are selectively activated by the column driver 304 in response to column address decoder 305. Thus, a row and column address is provided for each pixel.

Imager 14 is operated by a timing and control circuit 306, which controls decoders 303 and 305 for selecting the appropriate row and column lines for pixel readout, and row and column driver circuitry 302, 304, which apply driving voltages to the drive transistors of the selected row and column lines. The pixel signals, which typically include a pixel reset signal Vrst and a pixel image signal Vsig for each pixel (or each photosensitive region of each pixel) are sampled by sample and hold circuitry 307 associated with the column driver 304. A differential signal Vrst–Vsig is produced for each pixel (or each photosensitive area of each pixel), which is amplified by an amplifier 308 to produce analog signal Vin that is digitized by analog-to-digital converter 309. The analog to digital converter 309 converts the analog pixel signals to digital signals (e.g., a set of bits that form a digital code), which are fed to an image processor 310 which forms a digital image. Image processor 310 may, for example, be provided as part of image processing and data formatting circuitry 16 of FIG. 1.

Figure 3:
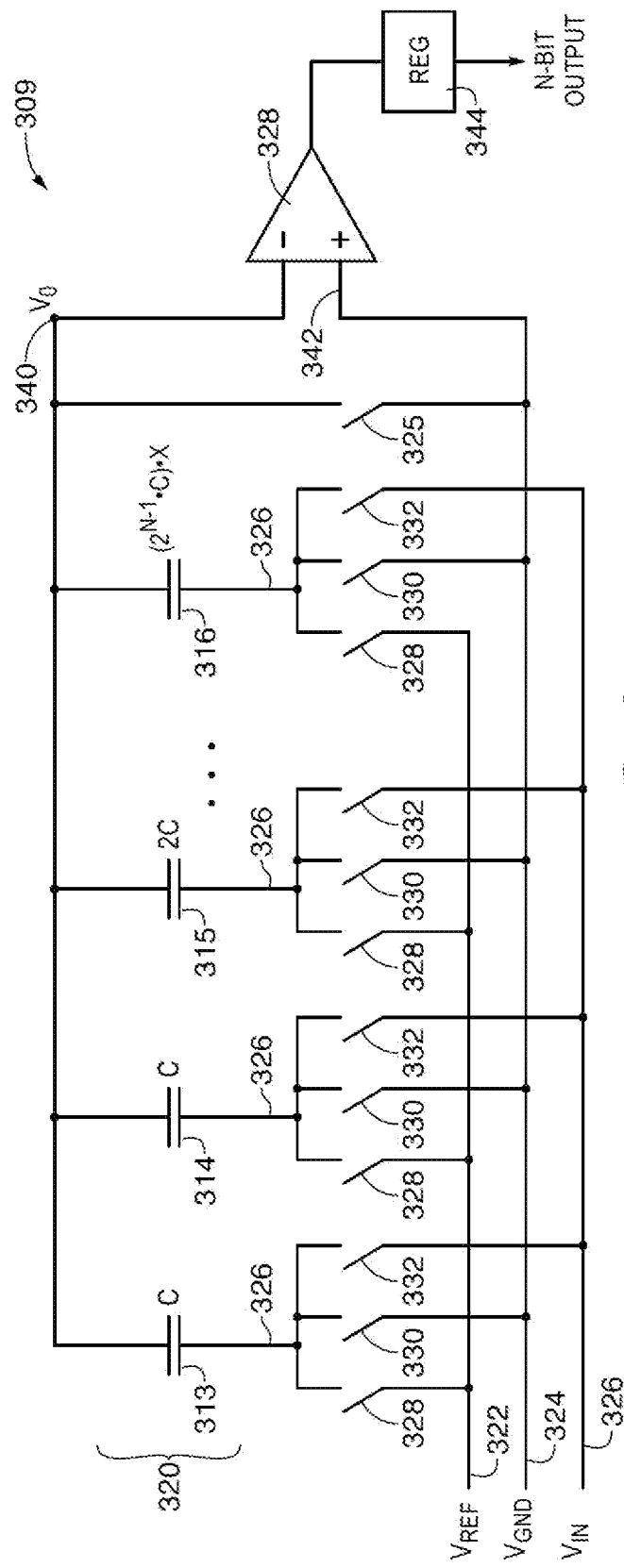
FIG. 3 is a circuit diagram of an analog-to-digital converter circuit having a most-significant bit capacitor with reduced capacitance in accordance with an embodiment of the present invention.

Analog-to-digital converter 309 may perform successive-approximation operations in converting analog pixel signals to digital signals and may therefore sometimes be referred to as a successive-approximation analog-to-digital converter. In some scenarios, analog-to-digital converter circuitry may include a register that stores successive-approximation results and may therefore be referred to as successive-approximation register (SAR) analog-to-digital converter circuitry. Control circuitry 312 may produce control signals in controlling portions of analog-to-digital converter 309 to perform successive-approximation operations (e.g., providing control signals to switches or other circuitry). FIG. 3 is a simplified circuit diagram of an illustrative successive-approximation analog-to-digital converter circuit 309.

As shown in FIG. 3, analog-to-digital converter circuit 309 may include a set of capacitors 320. The set of capacitors may include unit capacitors 313 and 314 having capacitance C. Each subsequent capacitor of the set may have a capacitance that is twice the capacitance of the current capacitor so that the set of capacitors forms a binary-mapped arrangement. For example, capacitor 315 may have capacitance 2C that is twice the capacitance of preceding capacitor 314, whereas the following capacitor may have a capacitance 4C that is twice the capacitance of capacitor 315. The number of capacitors in the set may be determined by the number of digital bits that analog-to-digital converter circuit 309 is capable of resolving. An N-bit analog-to-digital converter circuit may include N successive capacitors (e.g., having capacitances increasing by multiples of 2) and a base capacitor 310. The Nth capacitor that corresponds to the most significant bit (MSB) of the analog-to-digital converter may therefore have a capacitance of unit capacitance C multiplied by $2^{N-1}$. As shown in FIG. 3 and described in connection with subsequent figures, the binary weighting of the MSB (Nth) capacitor may be adjusted by a factor X to help handle mismatch between the capacitors of set 320. If desired, the capacitance of additional capacitors such as the N−2 capacitor, the N−3 capacitor, etc. may be similarly adjusted (e.g., these additional capacitors may, with the MSB capacitor, form a second set of capacitors that are not binary-mapped and have reduced capacitances relative to the ideal binary mapping).

The capacitors of set 320 may be selectively coupled to reference path 322, ground path 324, and input path 326 via capacitor terminals 326. A reference signal having voltage VREF may be provided via reference path 322, whereas ground voltage VGND may be provided via ground path 324 and analog pixel input signal VIN may be received on path 326 (e.g., from a pixel of pixel array 14 via a column line). This example is merely illustrative. In general, a low reference voltage may be provided via ground path 324 and the difference between the low reference voltage and reference signal VREF (e.g., a high reference voltage) may represent the input voltage range handled by the ADC. Each capacitor may be selectively connected to reference path 322, ground path 324, and input path 326 via respective switches 328, 330, and 332. The switches may be controlled by control signals provided by control circuitry such as control circuitry 312 of FIG. 2 to select which capacitor input terminals 326 are connected to reference path 322, ground path 324, or input path 326.

The capacitors of set 320 may be coupled between a shared capacitor terminal 340 and respective capacitor terminals 326. In the example of FIG. 3, shared capacitor terminal 340 may be selectively coupled to ground path 324 by a switch 325. Switch 325 may be controlled by a control signal provided by control circuitry. In some ADC arrangements, switch 325 may be coupled to a common-mode voltage node (not shown) instead of ground path 324. Shared capacitor terminal 340 may serve as a first input terminal to comparator 328, whereas a second input terminal 342 may be coupled to ground path 324. Comparator 328 may compare voltage Vo at input terminal 340 to power supply ground voltage VGND at input terminal 342 and provide a comparator output signal to register 344. Register 344 may have a bit-width equal to the number of bits that analog-to-digital circuit 309 is capable of resolving and may be controlled to store the comparator output signal at an appropriate bit position. The output of register 344 may serve as a digital output code of ADC 309.

Figure 4:
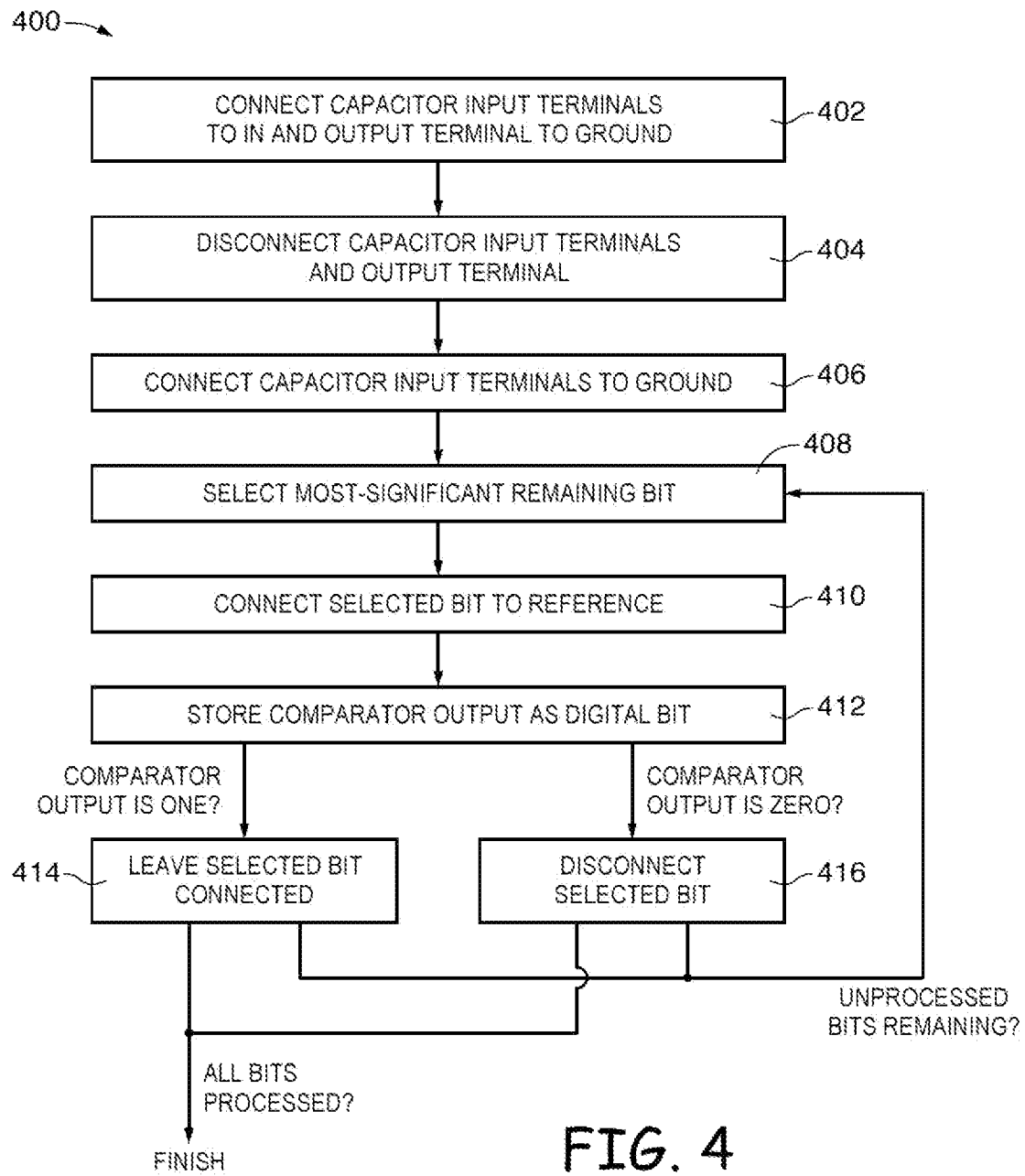
FIG. 4 is a flow chart of illustrative steps that may be performed to operate the analog-to-digital converter circuit of FIG. 3 in accordance with an embodiment of the present invention.

ADC 309 may utilize charge sharing between the set of capacitors 320 in converting analog input voltage VIN to an N-bit output signal stored by register 344. FIG. 4 is a flow chart 400 of illustrative steps that may be performed using analog-to-digital converter circuitry 309 to perform analog-to-digital conversion. The steps of flow chart 400 may be performed, for example, by control circuitry 312.

During step 402, capacitor output terminal 340 may be coupled to ground by switch 324 and each capacitor input terminal 326 may be coupled to input path 326 by enabling switches 332. The voltage across the set of capacitors 320 may therefore be set to the input voltage and charge may be distributed across the set of capacitors 320 as weighted by the capacitance of each capacitor. This example is merely illustrative. In some scenarios, an additional switch (not shown) may couple shared capacitor node 340 to input path 326 (e.g., instead of capacitor nodes 326). In this scenario, the input voltage may similarly be stored across the set of capacitors by enabling the additional switch and also switches 330.

During step 404, capacitor input terminals 326 may be disconnected from input path 326 (e.g., switches 332 may be disabled) and the output terminal may be disconnected from ground path 324 (e.g., switch 324 may be disabled). In other words, the set of capacitors 320 may be disconnected from signal paths and left floating with voltage VIN stored across the set of capacitors.

During step 406, analog-to-digital circuitry 309 may connect capacitor input terminals 326 to ground and the set of capacitors 320 may drive floating output terminal 340 to voltage VIN below ground (e.g., VGND−VIN) due to the stored voltage VIN across the set of capacitors 320. This example is merely illustrative. If desired, step 406 may be omitted in scenarios such as when the power supply for the ADC does not accommodate voltages below VGND (e.g., single-supply arrangements).

During step 408, analog-to-digital circuitry 309 may select the most-significant remaining bit. In other words, ADC 309 may select the capacitor with the largest capacitance of the remaining capacitors that have not yet been selected during step 408.

During step 410, analog-to-digital circuitry 309 may connect the selected bit to reference path 322 (i.e., by connecting the input terminal 326 of the capacitor associated with the selected bit to reference path 322). For example, control circuitry 312 may enable switch 328 of the selected bit so that reference voltage VREF is applied to the input terminal 326 of the associated capacitor. The selected capacitor forms a voltage divider with the remaining, unselected capacitors and the output voltage is equal to input voltage VIN subtracted from the capacitance of the selected capacitor divided by the sum of the capacitances of the set of capacitors, multiplied by reference voltage VREF (i.e., $C_{selected}/C_{sum}*VREF-VIN$). If the output voltage is greater than VGND (e.g., greater than zero), comparator 328 may produce a logic one output. Conversely, if the output voltage is less than VGND, comparator 328 may produce a logic zero output.

During step 412, analog-to-digital circuitry 309 may store the comparator output as a digital bit in register 344. The comparator output may be stored at the bit location (position) of register 344 corresponding to the bit location selected during step 408. If the comparator output is one, the selected bit may remain connected to VREF during the operations of step 414. If the comparator output is zero, the selected bit may be disconnected during the operations of step 416. At the conclusion of steps 414 and 416, if unprocessed bits remain, the process may return to step 408 to process the remaining bits. If all bits have been processed, the operations of flow chart 400 may be complete.

Consider the scenario in which the most-significant bit of a three-bit analog-to-digital converter 309 is selected during step 408 (e.g., the capacitor having capacitance 4N). During subsequent step 410, the capacitive divider formed from the set of capacitors 320 may produce output voltage VO approximately equal to ½*VREF−VIN (i.e., 4/(1+2+4)*VREF−VIN). The comparator may therefore produce logic one if VIN is greater than ½ VREF and produce logic zero if VIN is less than ½ VREF. Therefore the most significant bit of register 344 may be set to logic one during step 412 if VIN is greater than ½ VREF and may be set to logic zero if VIN is less than ½ VREF. The remaining bits may be processed similarly.

The capacitors of set 320 may be subject to variations due to manufacturing tolerances and other variations such as process variations. Such variations can cause mismatch between the actual capacitance of the capacitors and the desired capacitance. For example, capacitor 315 may have an actual capacitance that is greater than 2C or less than 2C due to manufacturing variations. In scenarios in which the actual capacitance is greater than a desired capacitance, the analog-to-digital circuit may be unable to resolve some analog input voltage levels, leading to missing decision levels. Consider the scenario for a 3-bit analog-to-digital converter in which the set of capacitors is designed to include a unit capacitor (e.g., capacitance C), a 2C capacitor, and a 4C capacitor, but the 4C capacitor has a capacitance that is greater than 4N. In this scenario, the range of voltages that maps to digital output "011" may be excessively large, because the 4N capacitor stores an excessively large proportion of the total charge on the set of capacitors and therefore the comparator does not assert a digital output for the most significant bit (associated with the 4N capacitor) until the input voltage reaches a threshold voltage that is greater than ½ of VREF.

Figures 5, 6:
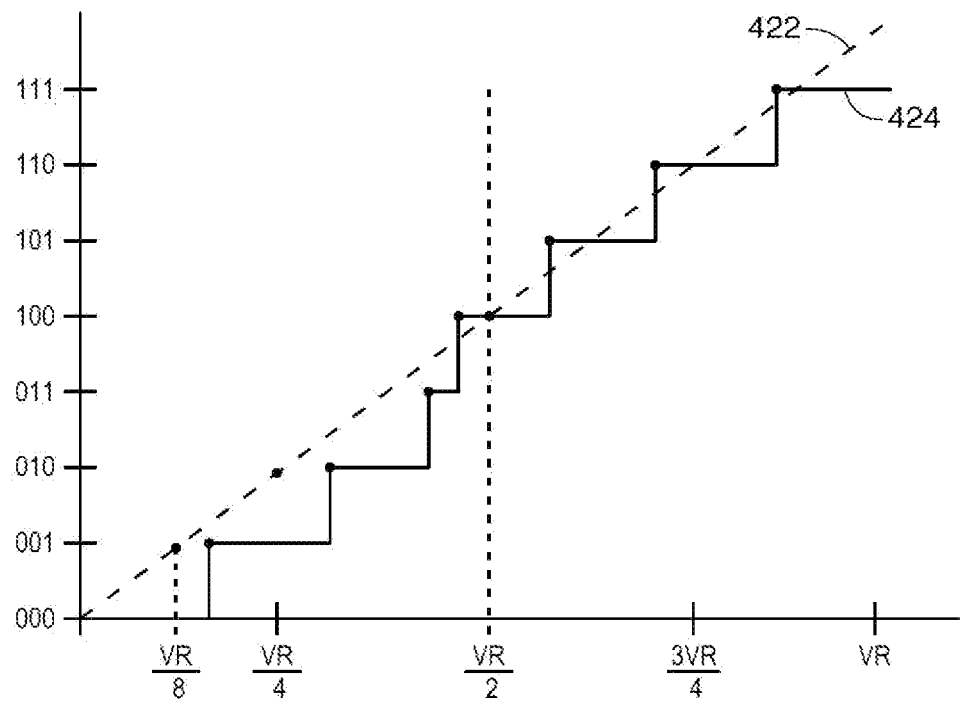
FIG. 5 is an illustrative graph mapping input voltages to digital output codes for an analog-to-digital converter circuit having a most-significant bit capacitor with reduced capacitance in accordance with an embodiment of the present invention.
FIG. 6 is an illustrative table having entries that assign weights to bit positions of digital output codes for an analog-to-digital converter circuit having a most-significant bit capacitor with reduced capacitance in accordance with an embodiment of the present invention.

To help ensure that the analog-to-digital converter circuit is capable of resolving the intended level of detail (e.g., at least in units of $VREF/2^{N-1}$), the most significant bit may be provided with a capacitor having a capacitance that is less than the binary mapping (e.g., less than $2^{N-1}$ times the unit capacitance). FIG. 5 is an illustrative diagram illustrating a scenario in which a 3-bit analog-to-digital converter is provided with a reduced-value most-significant bit capacitor. The diagram of FIG. 5 shows a mapping of input voltages (e.g., VIN) to 3-bit digital output codes produced by analog-to-digital converter circuitry and stored at register 344.

Line 422 illustrates an ideal 3-bit binary mapping between input voltages ranging from zero to VR. For example, binary output code "100" is approximately half of "111" and corresponds to VR/2. As another example, binary output code "010" is half of "100" and corresponds to VR/4. Line 424 shows an illustrative 3-bit mapping between input voltages and digital output bits for an analog-to-digital converter having a reduced capacitance most-significant bit. For example, capacitor 316 may have capacitance 4C*x, where x is less than one such that the capacitance is less than 4C. Factor x may be selected to outweigh variations such as process, voltage, and temperature variations. For example, the range of variations may be determined based on process characteristics used in fabricating the capacitors or by testing of the process, and factor x may be selected such that the process variations do not cause the capacitance to exceed the ideal binary capacitance (which would lead to missing decision levels).

As shown by line 424, reduction of the capacitance of most-significant bit capacitor 316 skews the analog-to-digital mapping from ideal line 422. For each digital code in which the most significant bit is logic one, the voltage decision threshold may be smaller than ideal, because the MSB capacitor is smaller than ideal (e.g., line 424 may be shifted to the left of line 422). For each digital code in which the most significant bit is logic zero, the voltage threshold may be greater than ideal (e.g., line 424 may be shifted to the right of line 422). For example, the threshold at which line 424 transitions from code "000" to code "001" is greater than ideal threshold VR/8, because the LSB capacitor is proportionally greater relative to the sum of all of the capacitors due to the reduction of the MSB capacitance.

Systematically implementing MSB capacitors with reduced capacitance allows mismatch to be corrected using digital processing. FIG. 6 is an illustrative diagram of a table 430 that may be used in digitally correcting intentional mismatch in MSB capacitors. Table 430 includes entries 432 that each identifies a bit position and a corresponding weight. The entries of table 430 may provide a mapping between digital output bits produced by an analog-to-digital converter circuit to a corrected digital value. The weights assigned to each bit position are determined based on the capacitance of the corresponding capacitor of that bit position. Table 430 may include a first set of entries 434 in which the weights are assigned in a binary mapping (e.g., 1, 2, 4, 8, 16, etc.). These weights match the capacitances of the corresponding capacitors in the analog-to-digital converter circuit (e.g., a first set of binary-mapped capacitors of the ADC). Table 430 may include a second set of entries 436 in which the weights are assigned reduced values relative to the binary mapping. In the example of FIG. 6, the second set of entries 436 includes only an entry 432 for the most-significant bit position (N-1) and assigns a corresponding weight $2^{N-1}*x$ that is less than the binary mapping $2^{N-1}$ (i.e., x is less than 1). Scalar x corresponds to the induced reduction in capacitance of the corresponding capacitor of the analog-to-digital converter circuit and may be determined based on factors such as the capacitance tolerance range associated with process variations. This example is merely illustrative. If desired, the second set of entries 436 may include additional entries that assign reduced values for additional bit positions (e.g., N-2, N-3, etc.).

The example of FIG. 6 in which bit position to weight mappings are stored in a table is merely illustrative. If desired, weights may be stored at registers associated with respective bit positions. For example, bit position 0 may be assigned a first dedicated register at image processor 310 of FIG. 2 in which the weight of bit position 0 is stored, bit position 1 may be assigned a second dedicated register, bit position 2 may be assigned a third dedicated register, and so on.

Figure 7:
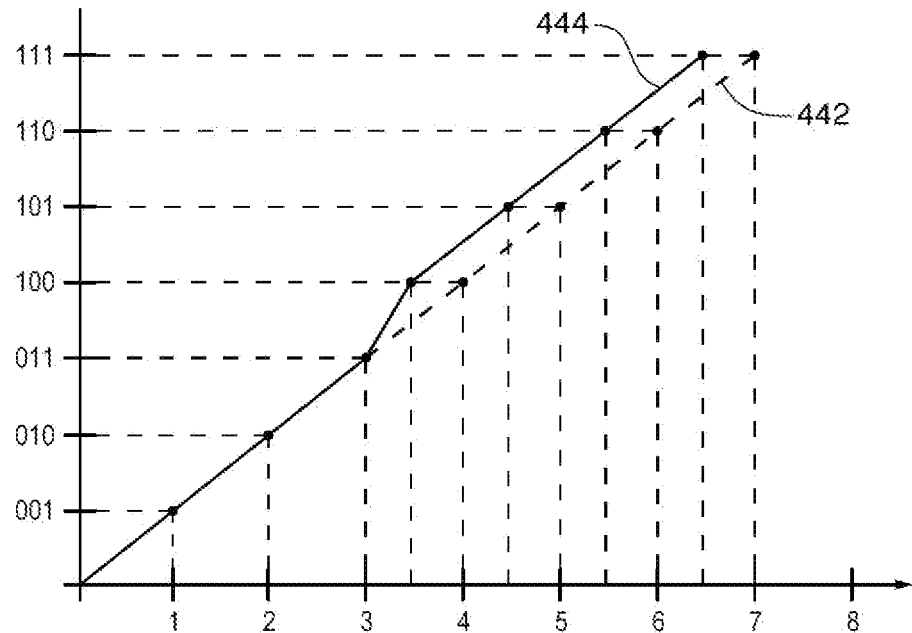
FIG. 7 is an illustrative graph showing how digital processing circuitry may generate corrected digital values from digital output codes produced by an analog-to-digital converter circuit having a most-significant bit capacitor with reduced capacitance in accordance with an embodiment of the present invention.

Table 430 may be stored and used by digital processing circuitry such as image processor 310 of FIG. 2. For example, image processor 310 may use table 430 in mapping digital output bits from multiple analog-to-digital converter circuits 309 into corrected digital values (e.g., the MSB capacitor of each of the analog-to-digital converter circuits may have a capacitance that is less than the binary mapping). FIG. 7 is an illustrative graph showing how image processor 310 may use table 430 in producing corrected digital values from digital output bits of an analog-to-digital converter circuit.

As shown in FIG. 7, dashed line 442 represents the binary mapping of digital output code bits to digital values. For example, code "100" maps to digital value 4, whereas code "010" corresponds to digital value 2. Line 444 shows a modified mapping that has been corrected to accommodate an intentionally-reduced MSB capacitance. For example, line 444 may illustrate the mapping produced by an image processor using table 430 of FIG. 6. Table 430 assigns a reduced weight for the most-significant bit. Thus, for digital code bits including an asserted most-significant bit, line 444 is shifted from line 442 and more accurately corresponds with the original analog voltages of line 424 of FIG. 5. In the example of FIG. 7, the N-1 bit position of a 3-bit analog-to-digital converter circuit may be assigned a weight of 3.5 (which is less than binary mapping of 4). In this scenario, digital code "100" maps to digital value 3.5, digital code "101" maps to digital value 4.5, digital code "110" maps to digital value 5.5, and digital code "111" maps to digital value 6.5, which more accurately represent the input analog voltages of FIG. 5.

Figure 8:
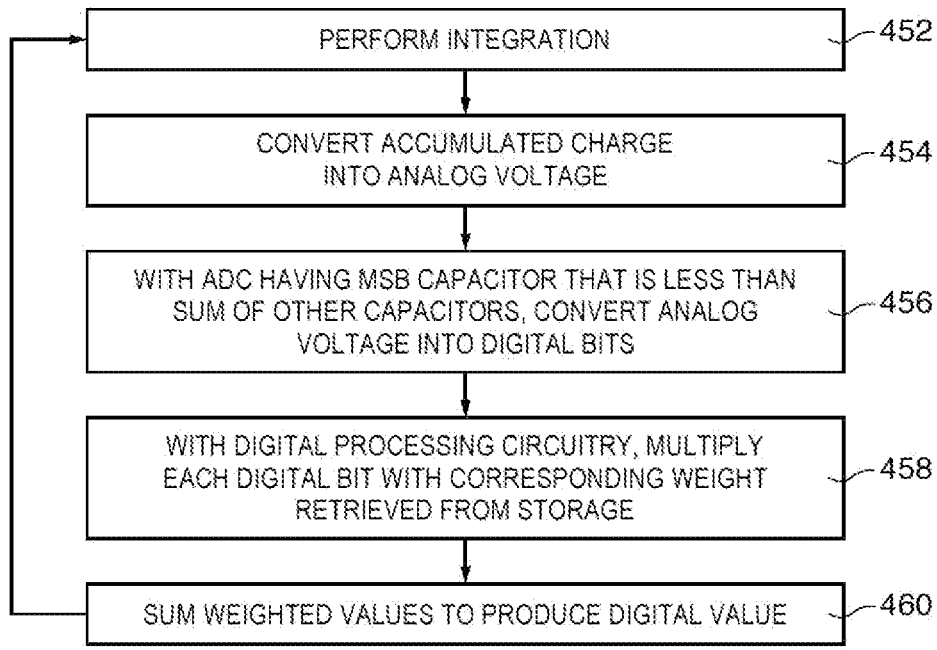
FIG. 8 is a flow chart of illustrative steps that may be performed by an imager to capture images and convert the images to digital values using an analog-to-digital converter circuit having a most-significant bit capacitor with reduced capacitance in accordance with an embodiment of the present invention.

FIG. 8 is a flow chart 450 of illustrative steps that may be performed to capture images using an analog-to-digital converter circuit having a reduced-capacitance MSB capacitor. During step 452, pixel integration may be performed in accumulating charge from captured incident light (e.g., using pixel array 301 of FIG. 2). During step 454, the accumulated charge for each pixel may be converted into a corresponding analog pixel output voltage. During step 456, the analog-to-digital converter may convert the analog voltage into digital code bits (e.g., by performing the operations of flow chart 400 of FIG. 4). Digital processing circuitry such as image processor 310 of FIG. 2 may subsequently process the digital code bits to map the digital code bits to a corrected digital value. During step 458, the digital processing circuitry may multiply each digital bit with a corresponding weight retrieved from table 430 of FIG. 6. During subsequent step 460, the digital processing circuitry may sum the weighted values to produce the corrected digital value. The process may subsequently return to step 452 to produce additional corrected ADC values from analog pixel output voltages.

By intentionally implementing the MSB capacitor of the analog-to-digital converter with reduced capacitance, the circuit area occupied by the analog-to-digital converter may be reduced while maintaining desired levels of accuracy for a desired resolution using digital weights. For example, unit capacitors and other capacitors may be reduced in size and capacitance while maintaining desired levels of conversion accuracy for a given resolution. If desired, increased levels of resolution may be provided using digital weights while maintaining the amount of circuit area occupied by the analog-to-digital converter.

Figure 9:
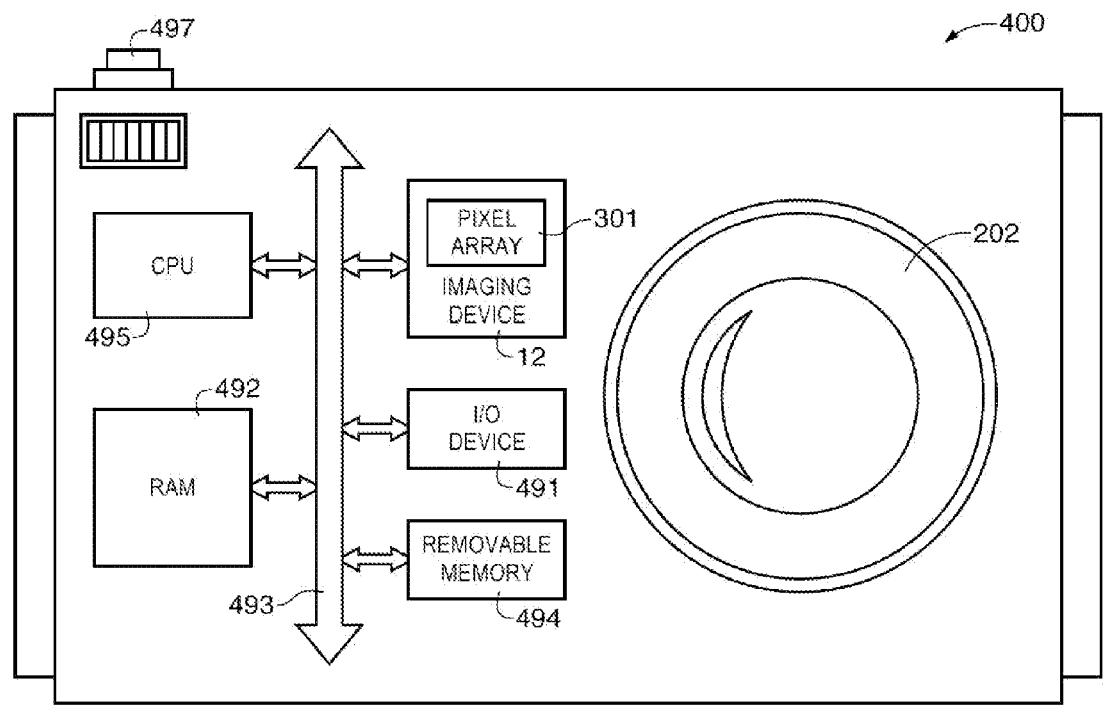
FIG. 9 is a block diagram of a processor system employing the imager of FIG. 2 in accordance with an embodiment of the present invention.

FIG. 9 is a simplified diagram of an illustrative processor system 400, such as a digital camera, which includes an imaging device 12 (e.g., the camera module of FIG. 1) employing an imager having improved analog-to-digital circuitry as described above. The processor system 400 is exemplary of a system having digital circuits that could include imaging device 12. Without being limiting, such a system could include a computer system, still or video camera system, scanner, machine vision system, vehicle navigation system, video phone, surveillance system, auto focus system, star tracker system, motion detection system, image stabilization system, and other systems employing an imaging device.

Processor system 400, for example a digital still or video camera system, generally includes a lens 202 for focusing an image on pixel array 301 when a shutter release button 497 is pressed, central processing unit (CPU) 495, such as a microprocessor which controls camera and one or more image flow functions, which communicates with one or more input/output (I/O) devices 491 over a bus 493. Imaging device 12 also communicates with CPU 495 over bus 493. System 400 also includes random access memory (RAM) 492 and can optionally include removable memory 494, such as flash memory, which also communicates with CPU 495 over the bus 493. Imaging device 12 may be combined with the CPU, with or without memory storage on a single integrated circuit or on a different chip. Although bus 493 is illustrated as a single bus, it may be one or more busses, bridges or other communication paths used to interconnect system components of system 400.

Figure 10:
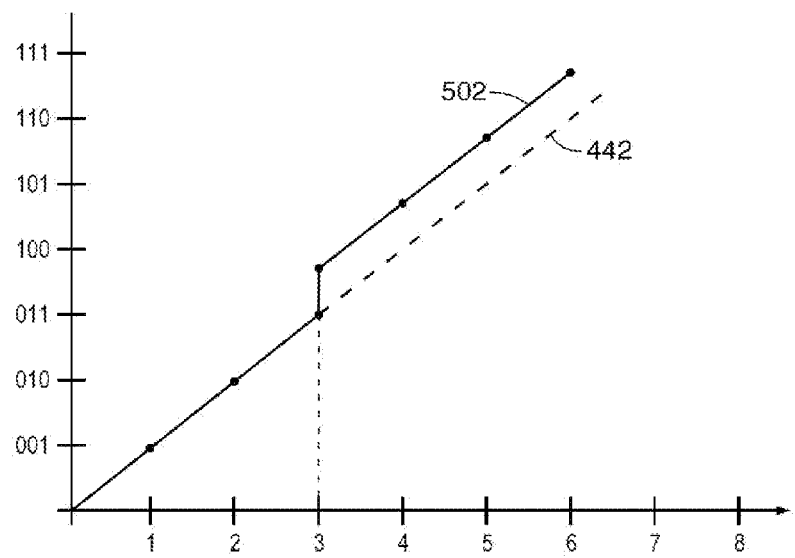
FIG. 10 is an illustrative graph mapping input voltages to digital output codes for an analog-to-digital converter circuit having a most-significant bit capacitor with reduced capacitance and in which truncated weights are assigned to the bit positions of the digital output codes in accordance with an embodiment of the present invention.

It can be challenging for digital conversion to produce floating point digital outputs. For example, circuitry capable of processing floating point digital outputs may be relatively complex. Digital processing circuitry that performs corrections on ADC output codes may be provided with truncated or otherwise rounded off weights that are assigned to the bit positions of the output codes. In the example of FIG. 10, the weight assignments of FIG. 7 are truncated to form integers. For example, the weight assigned to code "100" may be truncated from 3.5 to 3, producing line 502. The digital processing circuitry may be provided with relatively simple integer arithmetic circuitry for multiplying and adding integer weights.

Figure 11:
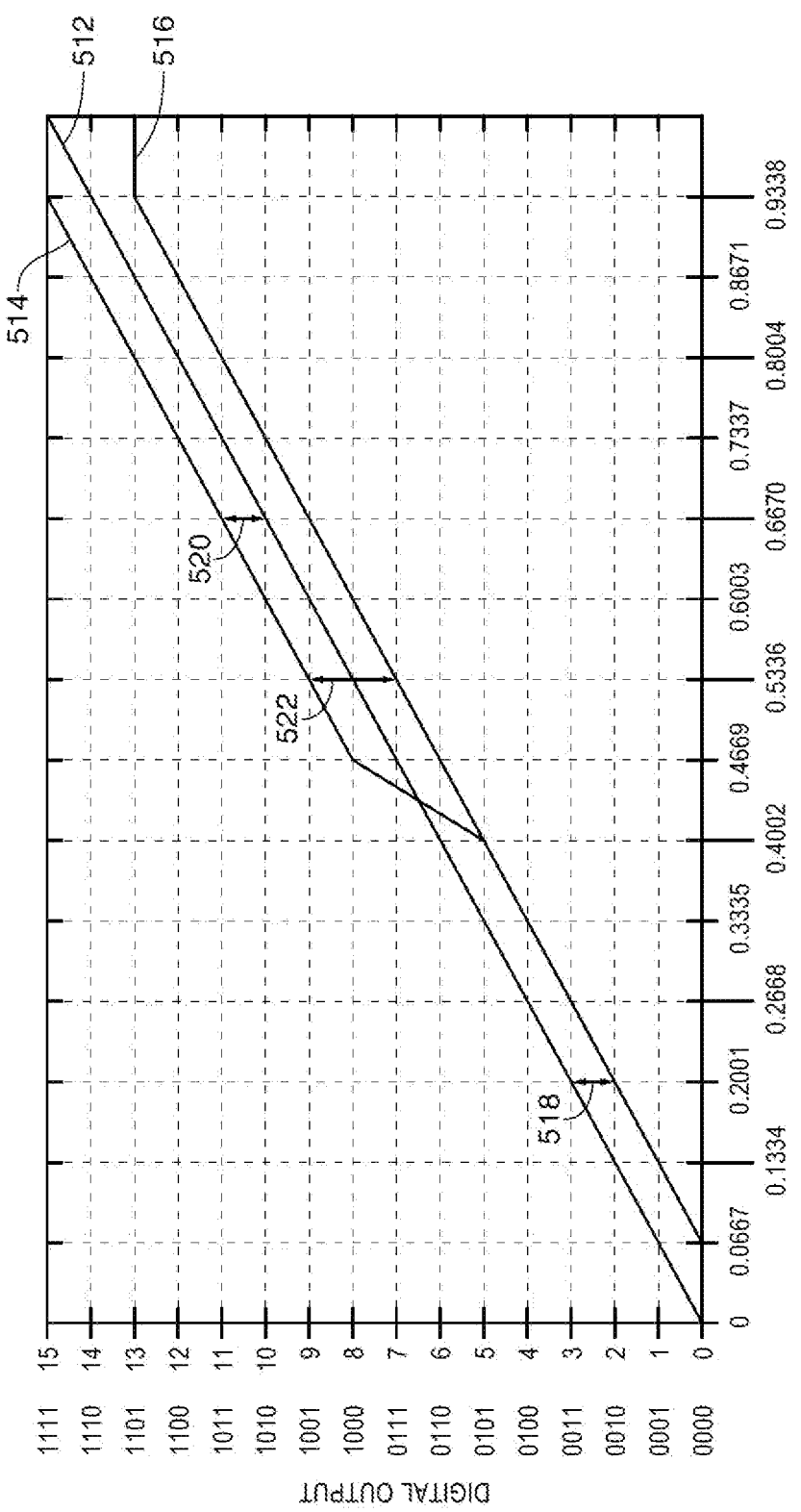
FIG. 11 is an illustrative example showing how a 4-bit ADC with a reduced most significant bit capacitance can be digitally corrected.

FIG. 11 is an illustrative example showing how a 4-bit ADC with a reduced MSB capacitance can be digitally corrected. As shown in the graph of FIG. 11, digital output values for a 4-bit ADC may range from 0-15, whereas the input voltage may range from 0-1 V (as an example). In general, the input voltage may range from zero to any desired reference voltage value. Line 512 illustrates the voltage-to-digital mapping corresponding to a binary capacitor arrangement. Line 514 illustrates the digital codes produced by an ADC with reduced MSB capacitance. As shown by line 514, the digital output codes are reduced from line 512 by amount 518 for voltage ranges in which the most significant bit is not asserted (i.e., decimal values 0-7) and are increased from line 512 by amount 520 for voltage ranges in which the most significant bit is asserted (i.e., decimal values 8-15). Line 516 illustrates the corrected voltage-to-digital mapping in which the digital output codes are weighted and summed. As shown by line 516, the reduced MSB capacitance is accommodated by digitally modifying the weighted decimal value of digital output codes in which the most significant bit is asserted (e.g., which shifts line 514 for these codes by amount 522 to form line 516).

Various embodiments have been described illustrating imagers with improved analog-to-digital converter circuitry. The analog-to-digital converter circuitry may produce a digital output code from an analog input voltage. The analog-to-digital converter circuitry may include a series of capacitors. The series may include a first set of multiple binary-mapped capacitors having binary-mapped capacitances in which each capacitor has twice the capacitance of a previous capacitor. The analog-to-digital converter circuitry may include a second set of one or more capacitors that have capacitances that are less than binary-mapped capacitance values (i.e., each capacitor of the second set has a capacitance that is less than twice the capacitance of a previous capacitor in the series). The digital output code may include bits having respective bit positions within the digital output code (e.g., ranging from least significant to most significant). During successive-approximation operations performed by the analog-to-digital converter circuitry, each bit of the digital output code may be produced using a corresponding capacitor. Digital processing circuitry such as an image processor may produce a digital value from the digital output code by multiplying the bits of the digital output code with respective weights determined based on the capacitance of the corresponding capacitors. In this way, the implemented mismatch may be digitally corrected while ensuring that there are no missing decision levels for the analog input voltage. By intentionally implementing reduced-capacitance mismatch for the most significant bit position, the capacitances (and therefore size) of all of the capacitors may be reduced, thereby more efficiently utilizing limited circuit area. Implementation of reduced-capacitance mismatch may be applied to any desired SAR ADC arrangements that utilize capacitors to perform conversion operations.

The foregoing is merely illustrative of the principles of this invention and various modifications can be made by those skilled in the art without departing from the scope and spirit of the invention.

What is claimed is:

1. Imaging circuitry, comprising:
   an analog-to-digital converter circuit that produces a digital output code from an analog input voltage and comprises a plurality of capacitors and an additional capacitor having a given capacitance, wherein the plurality of capacitors comprises a first capacitor and a set of capacitors, wherein the first capacitor has a first capacitance, wherein each of the capacitors in the set of capacitors has a capacitance that is equal to the first capacitance multiplied by some power of 2, and wherein the given capacitance is greater than the capacitances of each of the capacitors in the plurality of capacitors and less than twice the capacitance of a capacitor in the plurality of capacitors that has the largest capacitance; and
   digital processing circuitry that generates a digital output value from the digital output code from the analog-to-digital converter circuit.

2. The imaging circuitry defined in claim 1 wherein the analog-to-digital converter circuit comprises an N-bit analog-to-digital converter circuit, wherein each capacitor of the plurality of capacitors is associated with a respective bit of the analog-to-digital converter circuit and wherein the additional capacitor is associated with a most-significant bit of the analog-to-digital converter circuit.

3. The imaging circuitry defined in claim 2 wherein each bit of the analog-to-digital converter circuit has a respective bit position, wherein the digital processing circuitry stores a table having entries, and wherein each entry of the table identifies a respective bit position and a corresponding weight.

4. The imaging circuitry defined in claim 3 wherein the weights of the entries of the table that identify bit positions of the plurality of capacitors have a binary mapping.

5. The imaging circuitry defined in claim 4 wherein the weight identified by the entry of a most-significant bit position is less than $2N-1$.

6. The imaging circuitry defined in claim 3 wherein the digital processing circuitry produces the digital output value by multiplying each bit by the corresponding weight in the table and summing the weighted bits.

7. The imaging circuitry defined in claim 6 wherein the analog-to-digital converter circuitry further comprises a comparator having first and second comparator inputs and a comparator output, wherein the plurality of capacitors and the additional capacitor are coupled in parallel to the first comparator input, wherein the second comparator input is coupled to a power supply ground terminal.

8. The imaging circuitry defined in claim 7 wherein each capacitor of the plurality of capacitors and the additional capacitor is selectively coupled to an input path, a reference voltage path, and a power supply ground path by a respective set of switches, wherein the input path conveys the analog input voltage to the plurality of capacitors.

9. The imaging circuitry defined in claim 8 further comprising an array of pixels that captures incident light to produce the analog input voltage.

10. The imaging circuitry defined in claim 6 wherein the analog-to-digital converter circuitry further comprises a comparator having first and second comparator inputs and a comparator output, wherein the plurality of capacitors and the additional capacitor are coupled in parallel to the first comparator input, wherein the second comparator input receives a common mode voltage and wherein each capacitor of the plurality of capacitors and the additional capacitor is selectively coupled to an input path, a high reference voltage path, and a low reference voltage path by a respective set of switches, wherein the input path conveys the analog input voltage to the plurality of capacitors.

11. A method of operating an imager, the method comprising:
with an imaging pixel, producing an analog pixel signal; and
with an analog-to-digital converter circuit including a first capacitor with a first capacitance and a series of capacitors having respective capacitances, converting the analog pixel signal to a digital code, wherein the series of capacitors includes a first set of capacitors in which each capacitor of the first set has a capacitance that is equal to the first capacitance multiplied by some power of two, wherein the series of capacitors further includes a second set of at least one capacitor, wherein each capacitor of the second set has less than twice the capacitance of a previous capacitor of the series, and wherein each of the capacitors of the second set of capacitors has a capacitance that is less than the sum of the capacitances of all of the previous capacitors in the series.

12. The method defined in claim 11 further comprising:
with digital processing circuitry, processing the digital code from the analog-to-digital converter circuit to produce a digital value that compensates for mismatch associated with the second set of capacitors.

13. The method defined in claim 12 wherein the digital code comprises a plurality of bits having respective bit positions, wherein the first capacitor and each capacitor of the series of capacitors is associated with a corresponding bit of the plurality of bits, and wherein processing the digital code from the analog-to-digital converter circuit to produce the digital value that compensates for the mismatch associated with the second set of capacitors comprises:
identifying a weight that is assigned to each capacitor; and
for each bit position of the digital code, producing a weighted value by multiplying the corresponding bit of the digital code by the weight of the corresponding capacitor.

14. The method defined in claim 13 wherein processing the digital code from the analog-to-digital converter circuit to produce the digital value that compensates for the mismatch associated with the second set of capacitors further comprises:
summing the weighted values for the bit positions of the digital code.

15. The method defined in claim 14 wherein the weight for each capacitor is assigned based on the capacitance of that capacitor and wherein identifying the weight that is assigned to each capacitor comprises:
retrieving the weight for that capacitor from a table.

16. The method defined in claim 14 wherein converting the analog pixel signal to a digital code with the analog-to-digital converter circuit comprises:
performing successive-approximation operations using the first capacitor and the series of capacitors.

17. A system, comprising:
a central processing unit;
memory;
input-output circuitry; and
an imaging device, wherein the imaging device comprises:
a pixel array;
a lens that focuses an image on the pixel array; and
at least one analog-to-digital converter circuit that converts an analog pixel signal from the pixel array to a digital output code, the analog-to-digital converter circuit comprising:
a series of capacitors having respective capacitances, wherein the series of capacitors includes a set of binary-mapped capacitors and a most-significant-bit capacitor, wherein the capacitance of each of the binary-mapped capacitors in the set of binary-mapped capacitors is twice the capacitance of an another capacitor in the set of binary-mapped capacitors, wherein the most-significant-bit capacitor has a capacitance that is greater than each of the capacitances of the capacitors in the set of binary-mapped capacitors and has less than twice the capacitance of a given capacitor in the set, and wherein the given capacitor has the largest capacitance in the set of binary-mapped capacitors.

18. The system defined in claim 17 further comprising:
image processing circuitry that processes the digital output code from the analog-to-digital converter circuit to produce a digital pixel value.

19. The system defined in claim 18 wherein the digital output code comprises a plurality of bits having respective bit positions within the digital output code, wherein the bit of each bit position is produced using a corresponding capacitor of the series of capacitors, and wherein the image processing circuitry is configured to produce the digital pixel value by multiplying each bit by a weight determined from the capacitance of the corresponding capacitor.

20. The system defined in claim 19 further comprising:
storage circuitry that stores a table containing the weights for the determined from the capacitances of the capacitors.

21. The system defined in claim 17 wherein the analog-to-digital converter circuit comprises a successive-approximation analog-to-digital converter circuit.

* * * * *